United States Patent
Lin et al.

(10) Patent No.: US 8,078,864 B2
(45) Date of Patent: Dec. 13, 2011

(54) PORTABLE COMPUTER AND METHOD FOR PREHEATING PORTABLE COMPUTER BEFORE BOOTING

(75) Inventors: Chih-Hsiung Lin, Taipei (TW); Jing-Rung Wang, Taipei (TW)

(73) Assignee: Pegatron Corporation (TW)

( * ) Notice: Subject to any disclaimer, the term of this patent is extended or adjusted under 35 U.S.C. 154(b) by 331 days.

(21) Appl. No.: 12/360,978

(22) Filed: Jan. 28, 2009

(65) Prior Publication Data
US 2009/0198387 A1 Aug. 6, 2009

(30) Foreign Application Priority Data
Feb. 1, 2008 (TW) ................................ 97103986 A

(51) Int. Cl.
*G06F 9/00* (2006.01)
*G06F 15/177* (2006.01)
*G05D 23/00* (2006.01)
*G01K 7/00* (2006.01)
*G01K 17/00* (2006.01)

(52) U.S. Cl. ........................... 713/2; 700/300; 702/130
(58) Field of Classification Search .................. 713/1, 2, 713/300, 330; 700/299, 300; 702/99, 130, 702/132, 136; 361/1, 103, 139, 140, 704
See application file for complete search history.

(56) References Cited

U.S. PATENT DOCUMENTS

| 5,881,298 | A | 3/1999 | Cathey | |
|---|---|---|---|---|
| 6,195,245 | B1 | 2/2001 | Kobsa | |
| 7,472,267 | B2 * | 12/2008 | Park et al. | 713/100 |
| 7,698,578 | B2 * | 4/2010 | Williams et al. | 713/300 |
| 2006/0195710 | A1 | 8/2006 | Maeshima et al. | |
| 2008/0296397 | A1 * | 12/2008 | Cheng | 237/2 R |
| 2009/0295457 | A1 * | 12/2009 | Mowry et al. | 327/512 |
| 2010/0005285 | A1 * | 1/2010 | Yun | 713/2 |
| 2010/0061011 | A1 * | 3/2010 | Hsien | 360/97.02 |
| 2010/0070745 | A1 * | 3/2010 | Chiu | 713/2 |
| 2010/0296218 | A1 * | 11/2010 | Yen | 361/103 |

FOREIGN PATENT DOCUMENTS

| CN | 2670995 Y | 1/2005 |
|---|---|---|
| CN | 1782945 A | 6/2006 |
| TW | 479450 B | 3/2002 |
| TW | I244884 B | 12/2005 |
| TW | M317743 | 8/2007 |

* cited by examiner

*Primary Examiner* — Crystal J Barnes-Bullock
(74) *Attorney, Agent, or Firm* — Lowe Hauptman Ham & Berner, LLP

(57) ABSTRACT

The invention provides a portable computer. When a power input terminal of the portable computer is connected to a power source, a sensor senses the temperature of electronic components of the portable computer to provide a sensed temperature value. When the sensed temperature value is lower than a preset temperature value, a microprocessor controls an indication device to operate and controls the heating unit to heat the electronic components. When the sensed temperature value is higher than the preset temperature value, the microprocessor controls the indication device not to operate and controls the heating unit stop heating the electronic components.

9 Claims, 2 Drawing Sheets

PORTABLE COMPUTER AND METHOD FOR PREHEATING PORTABLE COMPUTER BEFORE BOOTING

RELATED APPLICATIONS

The present application is based on, and claims priority from, Taiwan Application Number 097103986, filed Feb. 1, 2008, the disclosure of which is hereby incorporated by reference herein in its entirety.

BACKGROUND OF THE INVENTION

1. Field of the Invention

The invention relates to a portable computer and, more particularly, to a method for preheating the portable computer before booting.

2. Description of the Related Art

In a portable computer, most of components including a central processing unit (CPU), a south bridge chip, a north bridge chip, a clock generator, a power regulator, a storage device, a liquid crystal display (LCD) and a battery are operable when ambient temperature is above 0° C. These components do not guarantee that they can work normally when the ambient temperature is below 0° C. Therefore, most portable computers are operable when the ambient temperature is above 0° C.

However, with the popularity of the portable computer, there are more and more demands for using the portable computer in a cold environment where the temperature is below 0° C. To make the computer used normally at low temperature, in a conventional design, the inner temperature of the computer is sensed after a power button is pressed. When the inner temperature is lower than operation temperature, important components such as the CPU, the south bridge chip, the north bridge chip and the storage device are heated, and a booting procedure is delayed. After the temperature of all the electronic components reaches the operation temperature, the booting procedure is performed.

When the portable computer is booted at low temperature in the above mode, since electronic components of the portable computer are needed to be heated after the power button is pressed to boot the computer, the booting procedure is delayed. Thus, a user may wrongly think the portable computer is broken and it cannot be booted. Moreover, in a cold environment, the battery of the portable computer also may be un-operable because of the low temperature. Thus, the electronic components of the portable computer cannot be heated by electricity of the battery, and the portable computer cannot be booted.

BRIEF SUMMARY OF THE INVENTION

The invention provides a portable computer and a method for preheating the portable computer before booting. The portable computer can be booted and operated normally and effectively when ambient temperature is below 0° C.

The invention provides a portable computer including a power input terminal used to be connected to a power source to provide power to the portable computer, a microprocessor coupled to the power input terminal, at least one heating unit coupled to the microprocessor and disposed on at least one electronic component in the portable computer, an embedded controller coupled to the microprocessor, at least one sensor coupled to the microprocessor and disposed on the electronic component in the portable computer to sense the temperature of the electronic component, a power button coupled to the microprocessor and an indication device coupled to the microprocessor. When the power input terminal is connected to the power source and the power button is pressed, the microprocessor receives a sensed temperature value from the sensor. When the sensed temperature value is lower than a preset temperature value, the microprocessor controls the indication device to operate, and controls the heating unit to heat the electronic component. When the sensed temperature value is higher than the preset temperature value, the microprocessor controls indication device not to work, and controls the heating unit to stop heating the electronic component. Thus, the power button can be pressed again to boot the portable computer.

Another aspect of the invention provides a method for preheating the portable computer before booting. The portable computer has a power input terminal, at least one heating unit disposed on at least one electronic component in the portable computer, a power button, at least one sensor disposed on the electronic component in the portable computer and an indication device. The method includes the following steps: (A) providing power to the power input terminal of the portable computer; (B) pressing the power button and sensing the temperature of the electronic component with the sensor to provide a sensed temperature value; (C) when the sensed temperature value is lower than preset temperature value, controlling the indication device to operate and controlling the heating unit to heat the electronic component; (D) when the sensed temperature value is higher than the preset temperature value, controlling the indication device not to operate and controlling the heating unit stop heating the electronic component; and (E) pressing the power button again to boot the portable computer.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE EMBODIMENTS

Figure 1:
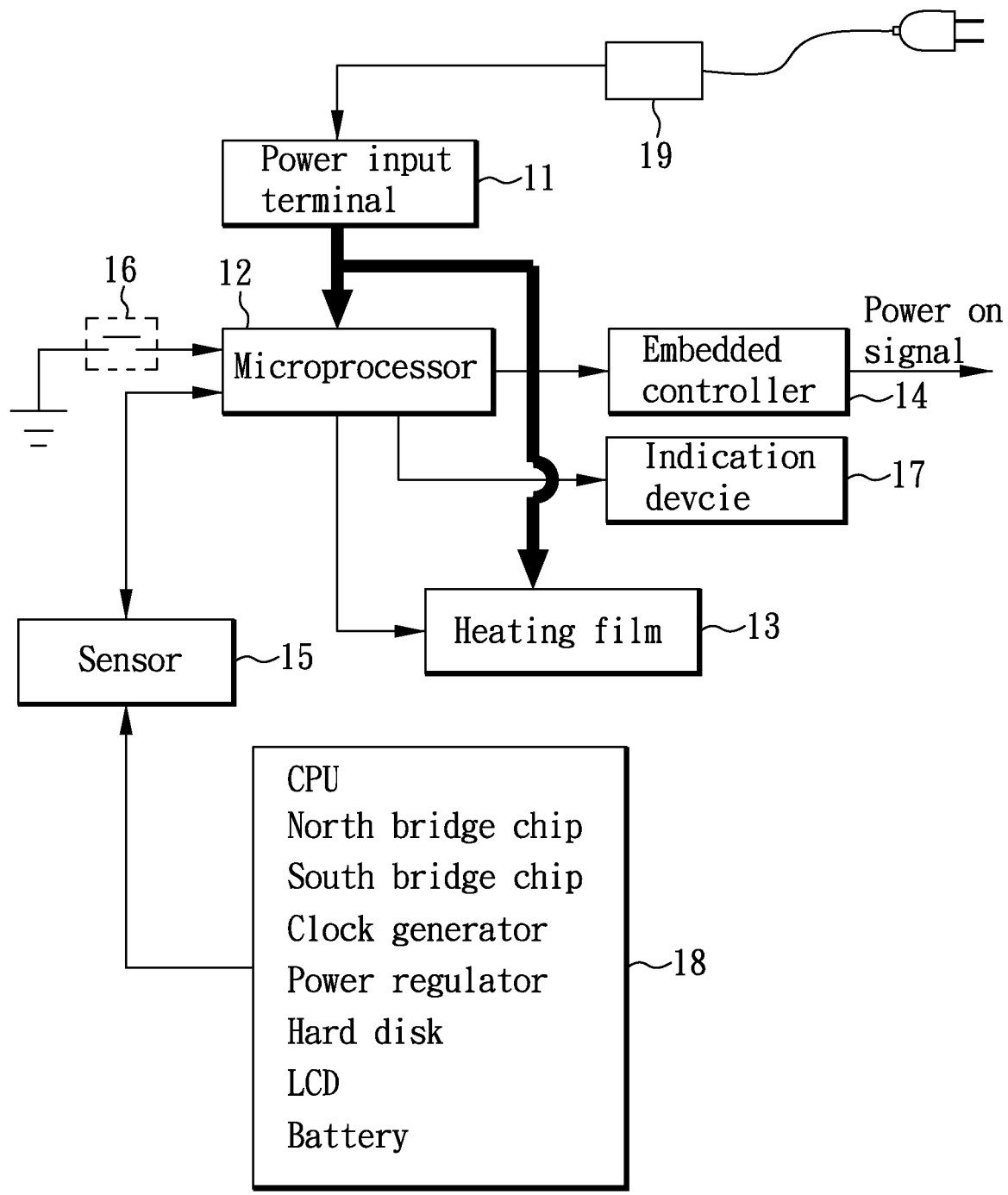
FIG. 1 is a functional block diagram showing a portable computer in a preferable embodiment of the invention.

FIG. 1 is a schematic diagram showing an architecture of a portable computer and a method thereof in a preferable embodiment of the invention. As shown in FIG. 1, the portable computer in the embodiment includes a plurality of electronic components 18, such as a CPU, a north bridge chip, a south bridge chip, a clock generator, a power regulator, a storage device, a LCD, a battery and so on. In this embodiment, only when the temperature is above operation temperature such as 0° C., the electronic components 18 can be operated normally. A booting device of the portable computer includes a power input terminal 11, a microprocessor 12, heating units 13, an embedded controller 14, sensors 15, a power button 16 and an indication device 17. In the embodiment, the heating units 13 are heating films.

The power input terminal 11 is used to be connected with a power source 19. The power source 19 is an alternating current-direct current (AC-DC) adapter inserted to a commercial power socket or an available battery for supplying power to the portable computer.

The microprocessor 12 is operationally coupled to the power input terminal 11 to obtain electric power needed when the microprocessor 12 operates. The heating units 13 are operationally coupled to the microprocessor 12 to be controlled by the microprocessor 12. The microprocessor 12 determines whether to control the heating units 13 to heat the electronic components 18. The heating units 13 are disposed on the electronic components 18 in the portable computer, respectively. For example, each electronic component 18 is equipped with a heating unit 13, respectively, several electronic components 18 close to each other share a heating unit 13, or an electronic component 18 (such as a storage device like a hard disk or the LCD) with a large volume is equipped with a plurality of heating units 13.

The embedded controller 14 is operationally coupled to the microprocessor 12 to provide a booting signal to the CPU to perform a booting procedure when the portable computer is booted. The sensors 15 are operationally coupled to the microprocessor 12 to provide a sensed temperature value sensed by the sensors 15 for the microprocessor 12. The sensors 15 are disposed on the electronic components 18 of the portable computer to sense the temperature of the surfaces of the electronic components 18. For example, each electronic component 18 is equipped with a sensor 15, respectively, or several electronic components 18 close to each other share a sensor 15.

The power button 16 is operationally coupled to the microprocessor 12. At ordinary ambient temperature, when the power button 16 is pressed, the sensor 15 provides a sensed temperature value to the microprocessor 12. When the sensed temperature is higher than operation temperature and the power button is pressed, the microprocessor 12 detects the booting operation and makes the embedded controller 14 to provide a booting signal to perform the booting procedure. The indication device 17 is operationally coupled to the microprocessor 12 and controlled by the microprocessor 12. The microprocessor 12 determines whether to control the indication device 17 to operate or not to operate. The indication device 17 is a LED preferably. The LED can be controlled by the microprocessor 12 to be luminous, twinkling or extinct.

Figure 2:
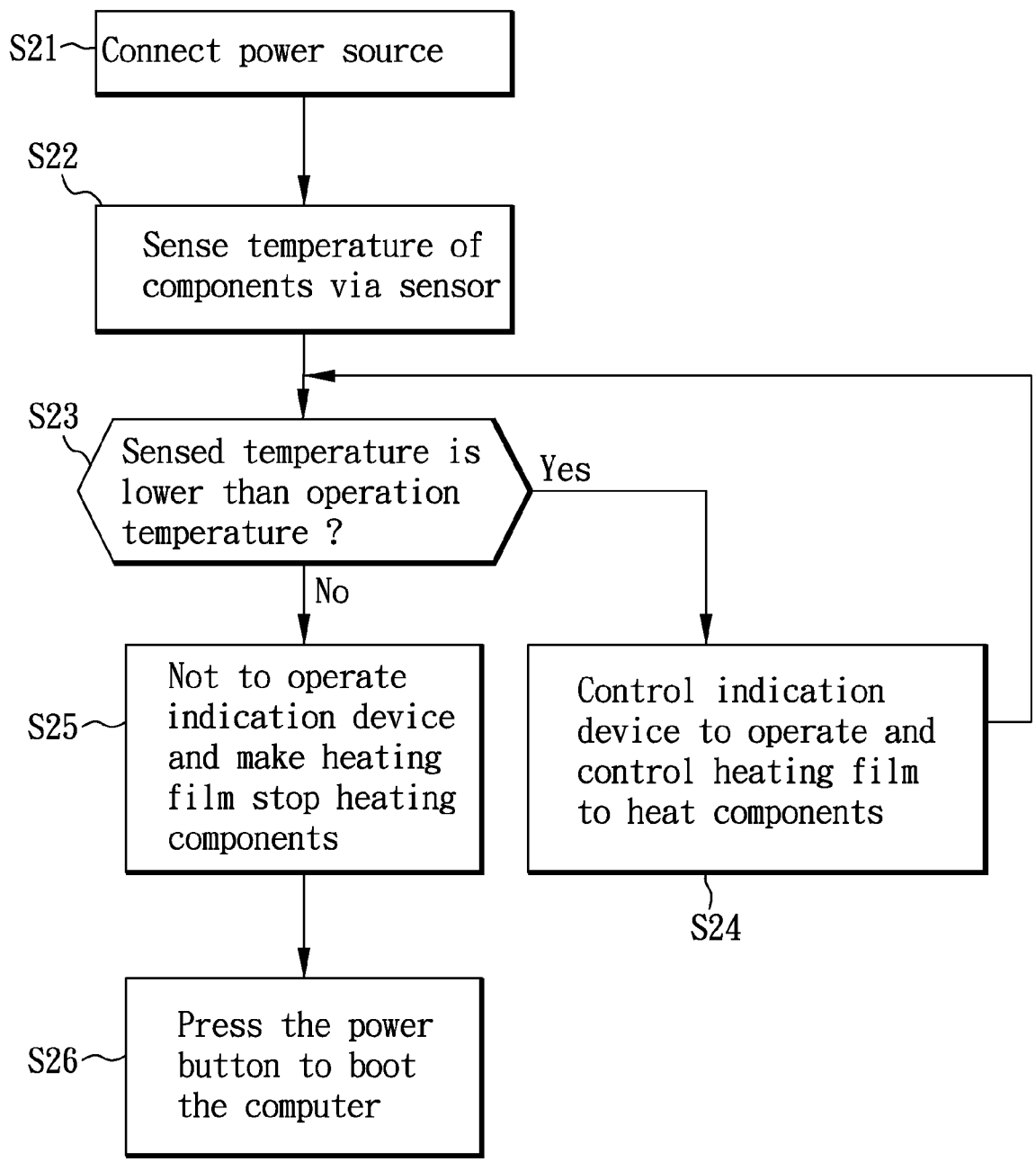
FIG. 2 is a control flow chart showing a booting method for preheating the portable computer in the preferable embodiment of the invention.

FIG. 2 is a flow chart showing a control flowchart of the method for preheating the portable computer before booting in the preferable embodiment of the invention. In step S21, the power input terminal 11 of the portable computer is connected to a power source 19 to provide power to the portable computer and the power button is pressed. For example, the power input terminal 11 of the portable computer is connected to the indoor or outdoor commercial power socket via the AD-DC adapter at low temperature, or an available battery is disposed at the power input terminal 11. When the power input terminal 11 is connected to the power source 19, the power source 19 provides power to the microprocessor 12, the embedded controller 14, the sensors 15 and so on. In step S22, the sensors 15 sense the temperature of the electronic components in the portable computer to provide a sensed temperature value to the microprocessor 12.

In step S23, the microprocessor 12 determines whether to control the indication device 17 and the heating units 13 to work. In step S24, when the sensed temperature value is lower than a preset temperature value of the portable computer, such as 0° C., the microprocessor 12 controls the indication device 17 to operate and controls the heating units 13 to heat the electronic components 18 of the portable computer. Thus, the temperature of the surfaces of the electronic components 18 increases. The microprocessor 12 controls the indication device 17, such as the LED, to be luminous or twinkling to indicate to a user that the temperature of the portable computer is too low and the portable computer cannot be booted and used temporarily. At that moment, the microprocessor 12 neglects or cuts off any operations of pressing the power button 16. Therefore, even though the user presses the power button 16, the portable computer does not perform the booting procedure.

In step S25, when the sensed temperature value is higher than the preset temperature value, the microprocessor 12 controls the indication device 17 not to operate and controls the heating units 13 to stop heating the electronic components 18 in the portable computer. At that moment, the ambient temperature reaches the operation temperature of the portable computer. In step S26, when the power button 16 is pressed again, the microprocessor 12 makes the embedded controller 14 to generate a booting signal to boot the portable computer.

To sum up, for a portable computer which cannot be booted in a cold environment and a method thereof according to the preferable embodiment of the invention, when the portable computer is connected to an available power source, the electronic components of the portable computer are heated immediately, and the LED is controlled to be luminous or twinkling to indicate to the user that the portable computer cannot be booted and used temporarily. Therefore, the problem that the user wrongly thinks the portable computer is broken and it cannot be booted can be avoided, and the user can use the portable computer at low temperature.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

What is claimed is:

1. A portable computer comprising:
    a power input terminal;
    a heating unit disposed on an electronic component in the portable computer;
    a sensor disposed on the electronic component in the portable computer, for sensing the temperature of the electronic component and providing a sensed temperature value;
    a power button;
    an indication device; and
    a microprocessor, operationally coupled to the power input terminal, the heating unit, the sensor, the power button and the indication device, respectively, and receiving the sensed temperature value from the sensor,
    wherein
        when the power input terminal is connected to a power source and the power button is pressed, if the sensed temperature value is lower than a preset temperature value, the microprocessor controls the indication device to operate and controls the heating unit to heat the electronic component, and
        when the sensed temperature value is higher than the preset temperature value, the microprocessor controls the indication device not to operate and controls the heating unit to stop heating the electronic component and the power button is configured to be pressed again to boot the portable computer.

2. The portable computer according to claim 1, wherein the electronic component includes a central process unit (CPU), a north bridge chip, a south bridge chip, a clock generator, a power regulator, a storage device, a liquid crystal display (LCD) or a battery.

3. The portable computer according to claim 1, wherein the preset temperature value is 0° C.

4. The portable computer according to claim 1, wherein the indication device is a light emitting diode (LED).

5. The portable computer according to claim 1, wherein if the sensed temperature value is lower than the preset temperature value, the microprocessor cuts off a signal generated by the power button when the power button is pressed.

6. The portable computer according to claim 1, wherein if the sensed temperature value is higher than the preset temperature value, the microprocessor receives a signal generated by the power button when the power button is pressed and makes an embedded controller of the portable computer to generate a booting signal to boot the portable computer.

7. A method for preheating a portable computer before booting, wherein the portable computer includes a power input terminal, a heating unit disposed on an electronic component in the portable computer, a power button, a sensor disposed on the electronic component in the portable computer and an indication device, the method comprising:
- providing power to the power input terminal of the portable computer;
- pressing the power button and sensing the temperature of the electronic component with the sensor to provide a sensed temperature value;
- when the sensed temperature value is lower than preset temperature value, controlling the indication device to operate and controlling the heating unit to heat the electronic component;
- when the sensed temperature value is higher than the preset temperature value, controlling the indication device not to operate and controlling the heating unit stop heating the electronic component; and
- pressing the power button again to boot the portable computer.

8. The booting method for preheating the portable computer according to claim 7, wherein the preset temperature value is 0° C.

9. The booting method for preheating the portable computer according to claim 7, wherein if the sensed temperature value is lower than the preset temperature value, a signal generated by the power button when the power button is pressed is cut off.

* * * * *